United States Patent
Ma et al.

(10) Patent No.: US 7,423,490 B2
(45) Date of Patent: Sep. 9, 2008

(54) WIDEBAND HIGH FREQUENCY CHOKES

(75) Inventors: Yin Tat Ma, Diamond Bar, CA (US); Jonathan Bruce Hacker, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 65 days.

(21) Appl. No.: 11/395,827

(22) Filed: Mar. 31, 2006

(65) Prior Publication Data

US 2007/0229168 A1    Oct. 4, 2007

(51) Int. Cl.
*H03F 3/191* (2006.01)

(52) U.S. Cl. ......................... 330/297; 330/306; 333/181

(58) Field of Classification Search ................ 330/297, 330/302, 306, 181
See application file for complete search history.

(56) References Cited

U.S. PATENT DOCUMENTS

| | | | |
|---|---|---|---|
| 4,760,356 A * | 7/1988 | Kempster | .................. 333/177 |
| 4,890,069 A * | 12/1989 | Duffalo et al. | ............... 330/277 |
| 6,538,537 B2 * | 3/2003 | Nishida et al. | ............... 333/245 |
| 7,193,477 B2 * | 3/2007 | Chang et al. | ................. 330/302 |
| 2007/0241838 A1 * | 10/2007 | Suzuki | ....................... 333/181 |

* cited by examiner

*Primary Examiner*—Steven J Mottola
(74) *Attorney, Agent, or Firm*—Eugene S. Indyk

(57) ABSTRACT

An n-stage RF choke comprises a series connection of two or more inductors connected in series between a source and a load. The inductor closest to the source has the largest inductance and the inductance closest to the load has the smallest inductance. The inductances of any inductors between the inductor closest to the supply and the inductor closest to the load decrease as a function of distance from the supply. The junctions between the inductors in the series connection are shunted to ground by capacitors connected in series with resistors that provide a matched termination for increasing bandwidth by lowering circuit Q factors and eliminating resonant frequencies. The capacitor closest to the supply has the largest capacitance and the capacitor closest to the load has the smallest capacitance. Any intermediate capacitors decrease in capacitance as a function of distance from the supply. Such an arrangement provides a high impedance that isolates the load from the supply at a wide range of frequencies.

7 Claims, 9 Drawing Sheets

$L \cong \mu_r \mu_0 n^2 r$, n=turns, r=radius

INDUCTANCE IS PROPORTIONAL TO THE SQUARE OF THE NUMBER OF TURNS AND THE SIZE OF THE SPIRAL INDUCTOR

Cs=SERIES CAPACITANCE BETWEEN TURNS

Cp=PARALLEL CAPACITANCE TO BACKSIDE THROUGH SUBSTRATE

INDUCTOR MODEL WITH PARASITIC CAPACITANCE AND RESISTANCE INCLUDED

WIDEBAND HIGH FREQUENCY CHOKES

TECHNICAL FIELD

This disclosure relates to wideband high impedance circuitry. More specifically, this disclosure relates to wideband chokes that suppress unwanted AC signals in various kinds of circuitry, such as radio frequency amplifiers.

BACKGROUND

Chokes are used to block unwanted AC signals from various kinds of circuitry. For example, chokes can be used in the DC bias circuits for transistors. In these applications, chokes typically are inserted between DC bias power supplies and the terminals of the transistors that receive bias current from those power supplies.

For wideband circuitry, such as wideband RF amplifiers, there are two conflicting requirements for the RF choke design. For low frequency operation, the RF choke needs to have large inductance but only a moderate resonance frequency. For high frequency operation, the RF choke needs high resonance frequency but only a moderate inductance. A single inductance can not meet both requirements.

SUMMARY

The problem outlined above is solved by a choke comprising two or more inductors in series between a source component and a load, for example, between a DC bias power supply and the DC bias terminal of a transistor used in an RF amplifier. The inductor nearest to the source component has the largest inductance. The other inductors decrease in inductance as they get closer to the load. At the junctions between the inductors, capacitors shunted to ground are employed with the capacitor closest to the source component having the largest capacitance. The other capacitors decrease in capacitance as they get closer to the load. A resistor in series with each capacitor serves as a matched termination for increasing bandwidth by lowering circuit Q factors and eliminating resonant frequencies.

DETAILED DESCRIPTION

Figure 1:
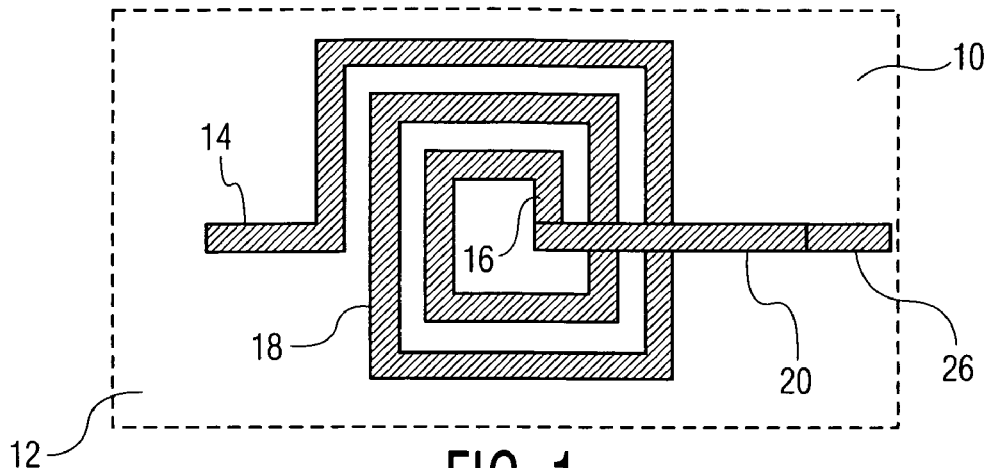
FIG. 1 is a top view of an illustrative on-chip spiral inductor that may be used in a choke in accordance with the invention.
Figure 2:
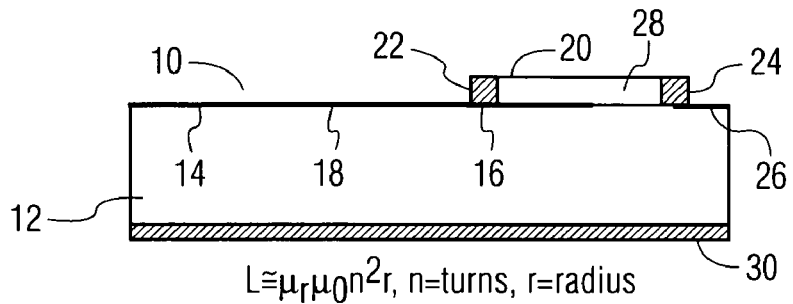
FIG. 2 is a side view of the inductor shown in FIG. 1.

FIGS. 1 and 2 show an illustrative on-chip spiral inductor that may be used in an RF choke in accordance with this invention. The inductor 10 is a layer of conductive material formed on the top surface of a dielectric substrate 12. The inductor 10 comprises a peripheral terminal 14 and an interior terminal 16 electrically connected together by a spiral of conductive material 18. The peripheral terminal may be connected to other electrical circuitry located on, off, or integrated into, the dielectric substrate 12. Access to the interior terminal 14 is provided by strip of conductive material 20 that bridges a conductive raised portion 22 connected to the interior terminal 16 and another conductive raised portion 24 on the substrate 12 outside the spiral of the inductor 10. The raised portion 24 is connected to another conductive region 26 on the substrate 12 that can be connected to other circuitry on, off, or integrated into the dielectric substrate 12. A dielectric layer 28 insulates the bridging strip 20 from the turns of the inductor 10. A conductive ground plane 30 is formed on the bottom surface of the dielectric substrate 12. The inductive structure described above may be formed on the substrate using any technique that is used to form electrically conductive patterns on a substrate, such as electroplating and photolithography.

The inductance of the structure shown in FIGS. 1 and 2 is proportional to the square of the number of turns and the size of the spiral that forms the inductor 10. The inductor 10 can be modeled by the equivalent circuit shown in FIG. 3. The equivalent circuit comprises an inductance 32 in series with a resistor 34 between terminals 14 and 16 in FIGS. 1 and 2. The inductance results from the spiral geometry of conductive material shown in FIG. 1. The resistor 34 is a parasitic resistance representing the resistive losses in the spiral of conductive material. The equivalent circuit also includes a series capacitor 36 in parallel with the inductor 32 and the resistor 34. This capacitor 36 represents the parasitic capacitance resulting from the separation between the turns of conductive material in the spiral structure. Finally, the equivalent circuit includes two parallel parasitic capacitors 38 and 40 that are the result of the dielectric separation of the metal layers on top of the substrate 12 from the metallic ground plane 30 on the bottom of the substrate 12.

Figure 3:
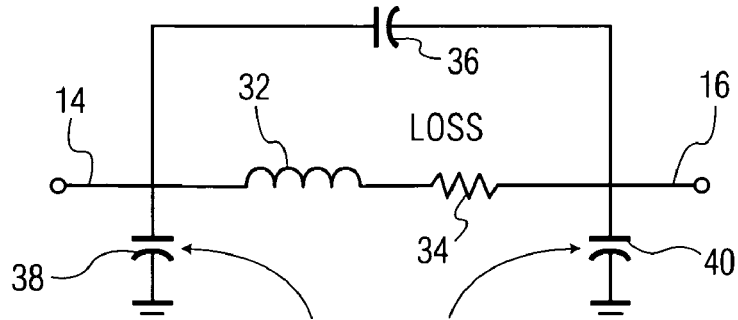
FIG. 3 is a schematic diagram of the equivalent circuit of the inductor shown in FIGS. 1 and 2.

Use of a single inductor like the one shown in FIGS. 1 and 2 as an RF choke is problematic because it is not a pure inductance, as shown in FIG. 3. RF chokes are inductive impedances used to block AC signals from DC circuits, for example, to block AC signals from the DC bias circuits of transistor amplifiers. The structure of FIGS. 1 and 2, however, begins to operate as a capacitor at high frequencies because the impedance effects of the parasitic capacitances shown in FIG. 3 begin to dominate the impedance effects of the inductance, particularly at the resonance frequency and above. The spiral inductor 10 thus can become a capacitor at high frequencies and actually couple unwanted AC signals to the circuitry from which it is to be blocked, thereby defeating the purpose of the choke.

It is possible to implement an effective choke at low frequencies using one inductor 10. At higher frequencies above the resonance frequency, a single inductor 10 cannot provide the high impedance needed to implement an effective RF choke, since the spiral inductor 10 operates essentially as a capacitance. It is also possible to implement an effective choke at higher frequencies by using a smaller inductor that has a relatively low inductance and high resonance frequency, but such a choke will not be effective at low frequencies because a low inductance cannot provide high impedance at low frequencies. It thus is impossible to implement a wideband RF choke using a single inductor 10.

Figure 4:
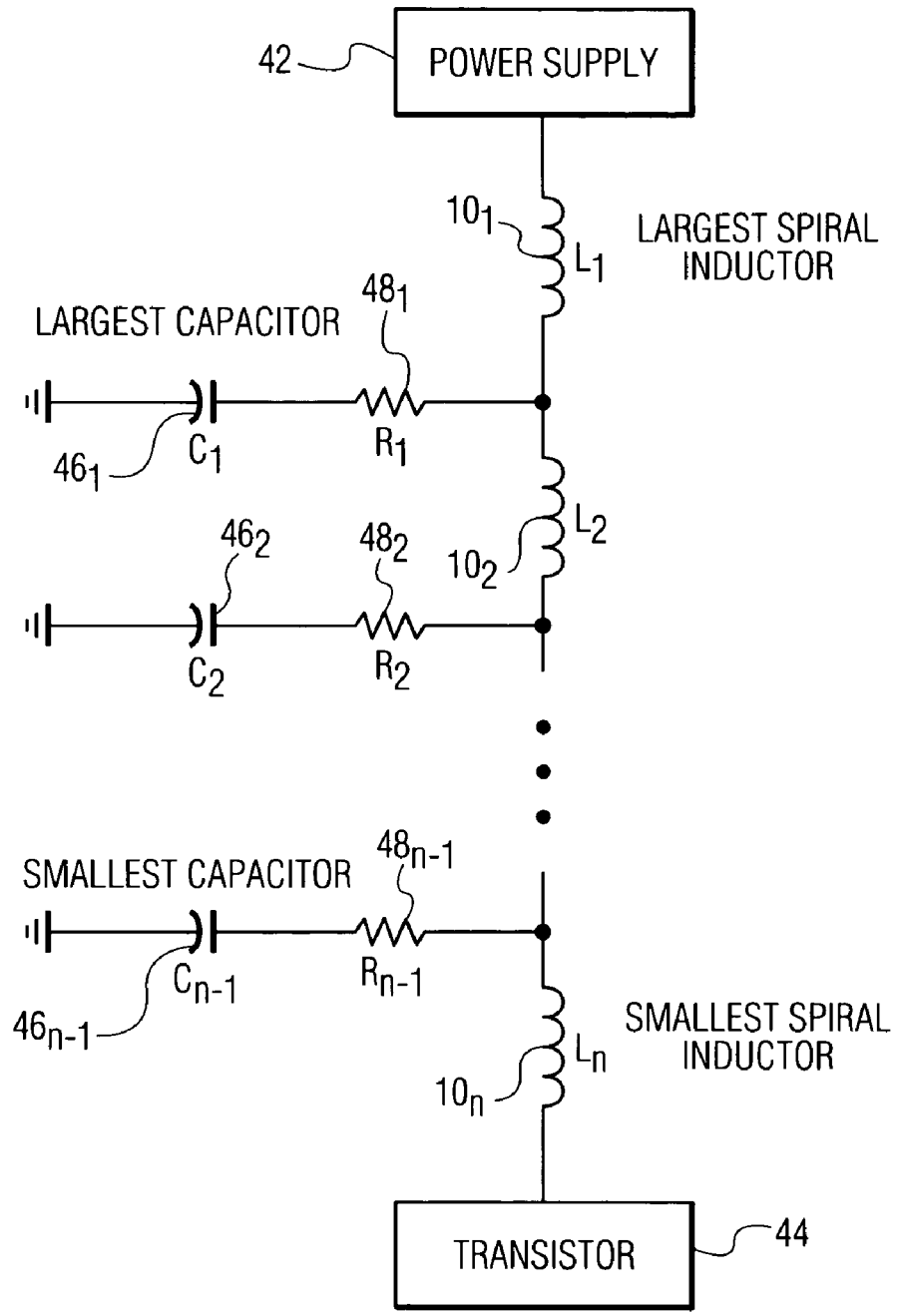
FIG. 4 is a schematic diagram of an illustrative n-stage RF choke in accordance with this invention.

The choke circuit of FIG. 4 solves this problem. The choke circuit of FIG. 4 comprises "n" inductors $10_1, 10_2, \ldots,$ and $10_n$, having respective inductances $L_1, L_2, \ldots,$ and $L_n$, connected in series between a power supply 42 and a transistor 44. The inductors in FIG. 4 may be the on-chip spiral inductors 10 shown in FIG. 1. The inductor $10_1$ nearest to the power supply 42 has the largest inductance $L_1$ and the other inductors $10_2, \ldots, 10_n$ decrease in inductance $L_2, \ldots, L_n$ as they get closer to the transistor 44. In other words, $L_1 > L_2 > \ldots > L_n$. The use of multiple inductors having decreasing inductances as in FIG. 4 increases the frequency range over which the choke can provide a desired high impedance. The number and size of the inductors are selected so that high impedance is provided by the choke circuit in a desired frequency range.

The junctions between the inductors $10_1, 10_2, \ldots,$ and $10_n$, are connected to ground by capacitors $46_1, 46_2, \ldots,$ and $46_{n-1}$, each in series with a respective resistor $48_1, 48_2, \ldots,$ and $48_{n-1}$. The capacitors $46_1, 46_2, \ldots,$ and $46_{n-1}$ have respective capacitances $C_1, C_2, \ldots,$ and $C_{n-1}$. The capacitor $46_1$ closest to the power supply 42 has the largest capacitance $C_1$ and the other capacitors $46_2, \ldots,$ and $46_{n-1}$ decrease in capacitance $C_2, \ldots,$ and $C_{n-1}$ as they get closer to the transistor 44. In other words, $C_1 > C_2 > \ldots > C_{n-1}$. The resistors $48_1, 48_2, \ldots,$ and $48_{n-1}$ have respective resistance values of $R_1, R_2, \ldots,$ and $R_{n-1}$ and, along with the capacitors $46_1, 46_2, \ldots,$ and $46_{n-1}$, serve as matched terminations for increasing bandwidth by lowering circuit Q factors and eliminating resonant frequencies. The values of inductors $L_1, L_2, \ldots,$ and $L_n$, capacitors $C_1, C_2, \ldots,$ and $C_{n-1}$ and resistors $R_1, R_2, \ldots,$ and $R_{n-1}$ can be optimized for bandwidth. At the lowest frequencies, the effective inductance is the sum of the inductances of all the inductors. At intermediate frequencies, the effective inductance is the sum of the inductances of the inductors closest to the transistor. At the highest frequencies, the effective inductance is that of the inductor closest to the transistor.

It is important that the inductances gradually decrease from the source component to the load component so that high impedance is maintained over a wide frequency band. If larger inductors are closer to the load component than the smaller inductors, the load component would begin to see a low impedance at relatively low frequency thereby preventing wideband operation.

The impedance network of FIG. 4 can be used anywhere a wideband high impedance is needed. FIG. 4 shows this network being used to isolate a power supply from a transistor. One example of such an application is the use of such a network to block AC from a DC bias supply circuit for a transistor used in a radio frequency integrated circuit amplifier. In that case, the largest inductor is connected to the output of the bias supply, and the smallest inductance is connected to a bias supply terminal of the transistor. Any number of intermediate sized inductors, capacitors, and resistors may be connected between the largest and smallest inductance depending on bandwidth requirements. Other illustrative circuits where chokes like the one illustrated in FIG. 4 may be used include impedance matching circuits, phase shifters, switches, attenuators, frequency converters, amplifiers, and any circuits requiring isolation between a source component and a load component and from which AC signals are to be blocked.

Figure 5:
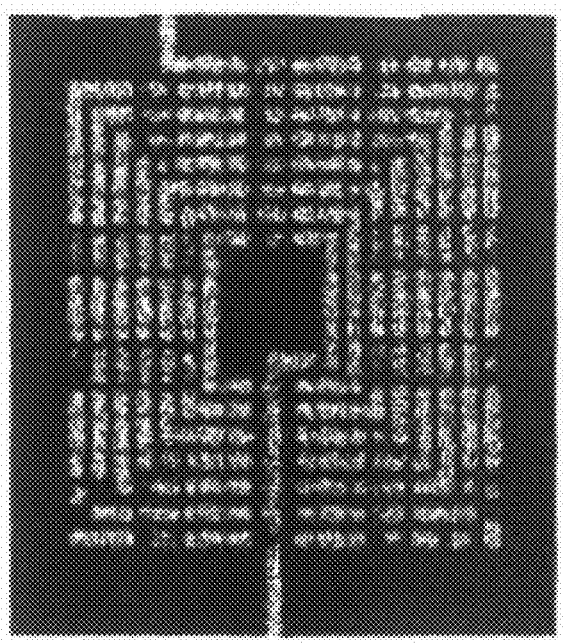
FIG. 5 shows an illustrative 10 nH inductor formed on a dielectric substrate.
Figure 6:
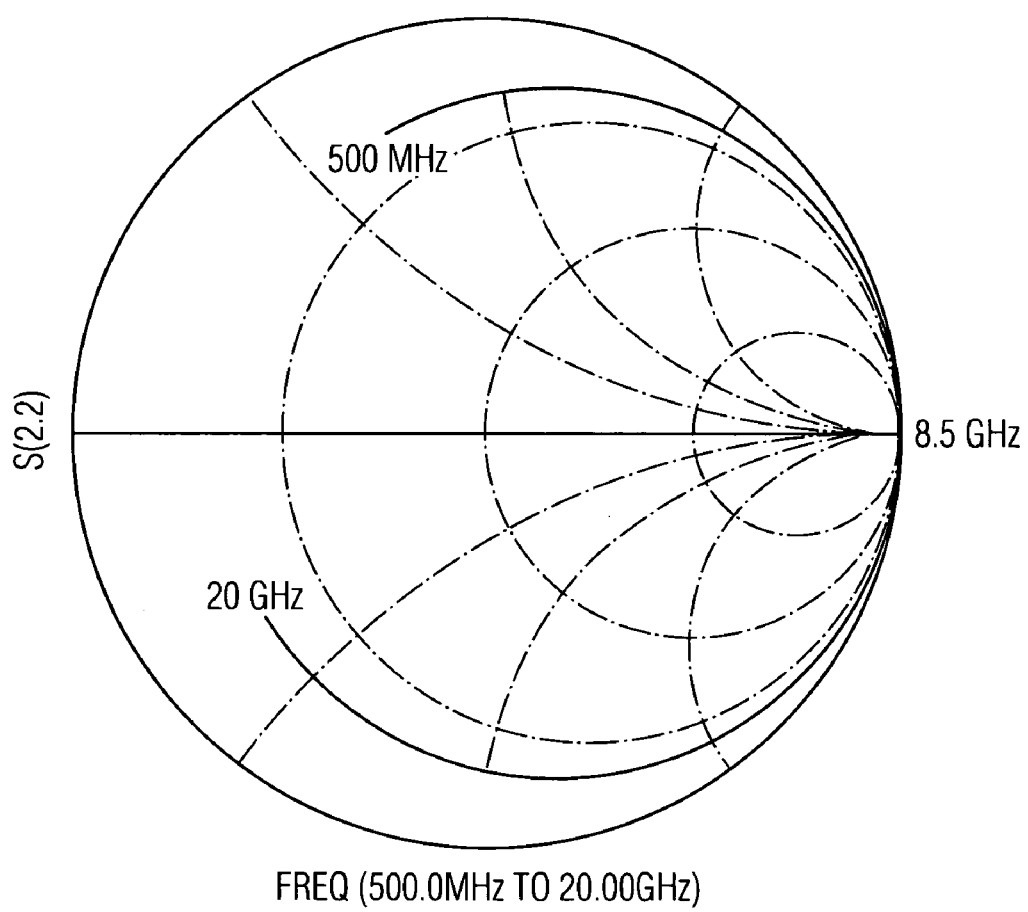
FIG. 6 shows a simulation of the high and low frequency characteristics of the inductor shown in FIG. 5.

FIG. 5 shows an illustrative 10 nH inductor composed of a 7-turn spiral of conductive material on a dielectric substrate 12. FIG. 6 is a Smith chart that plots the impedance of the FIG. 5 inductor with one end shorted to ground as a function of frequency from 500 MHz to 20 GHz. A Smith chart is a graphic tool for plotting impedance. The upper half of the Smith chart represents inductive impedance and the lower half of the Smith chart represents capacitive impedance. Toward left side of the Smith chart is low impedance. Toward right side of the Smith chart is high impedance. The plot in FIG. 6 shows that the inductor in FIG. 5 behaves as a relatively small inductive impedance at low frequencies near 500 MHz. The impedance remains inductive and increases in magnitude as frequency is increased above 500 MHz because the impedance is proportional to the magnitude of the frequency and the inductance. Since the inductor is small and thus has a small inductance, it is best used as a choke at higher frequencies. The magnitude of the impedance increases to a maximum at a resonant frequency of around 8.5 GHz. Above 8.5 GHz, the impedance becomes capacitive and gradually decreases in magnitude as the frequency increases to 20 GHz. (It should be pointed out that the inductor still can be used as a choke above resonance as long as the impedance remains high, but as soon as the impedance drops, it is no longer usable as a choke above resonance.)

Figure 7:
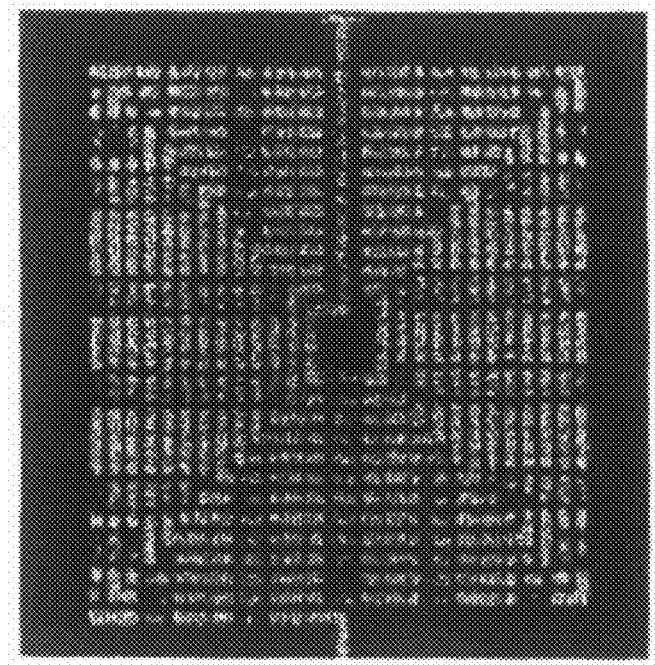
FIG. 7 shows an illustrative 30 nH inductor formed on a dielectric substrate.
Figure 8:
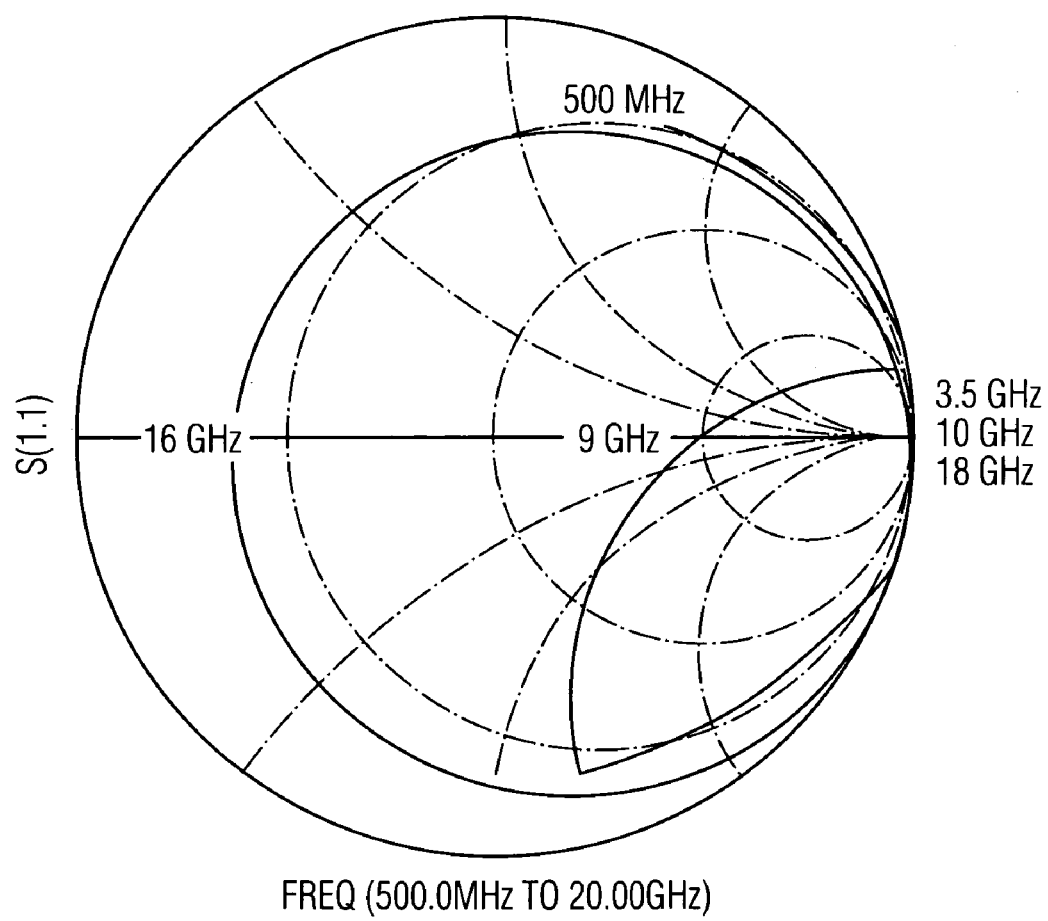
FIG. 8 shows a simulation of the high and low frequency characteristics of the inductor shown in FIG. 7.

FIG. 7 shows an illustrative larger 30 nH inductor composed of a 12-turn spiral of conductive material on a dielectric substrate 12. FIG. 8 is a Smith chart that plots the impedance of the FIG. 7 inductor with one end shorted to ground as a function of frequency from 500 MHz to 20 GHz. This plot shows that, in contrast to the inductor in FIG. 5, the inductor of FIG. 7 behaves as a relatively large inductive impedance down to 500 MHz. The impedance remains inductive above 500 MHz and increases to a maximum at a resonance frequency around 3.5 GHz. Above 3.5 GHz, the impedance of the FIG. 7 inductor turns capacitive and gradually decreases with increasing frequency. (As in the case of the inductor of FIG. 5, the inductor of FIG. 7 still can be used as a choke above resonance as long as the impedance remains high, but as soon as the impedance drops, it is no longer usable as a choke above resonance.) At higher frequencies, the impedance changes back and forth between capacitive and inductive. The impedance changes from inductive to capacitive at 3.5, 10 and 18 GHz. The impedance changes from capacitive to inductive at 9 and 16 GHz. The inductive impedance of the inductor of FIG. 7 is higher at lower frequencies than that of the inductor of FIG. 5, but the resonant frequency of the FIG. 7 inductor is lower than that of the FIG. 5 inductor.

Figure 9:
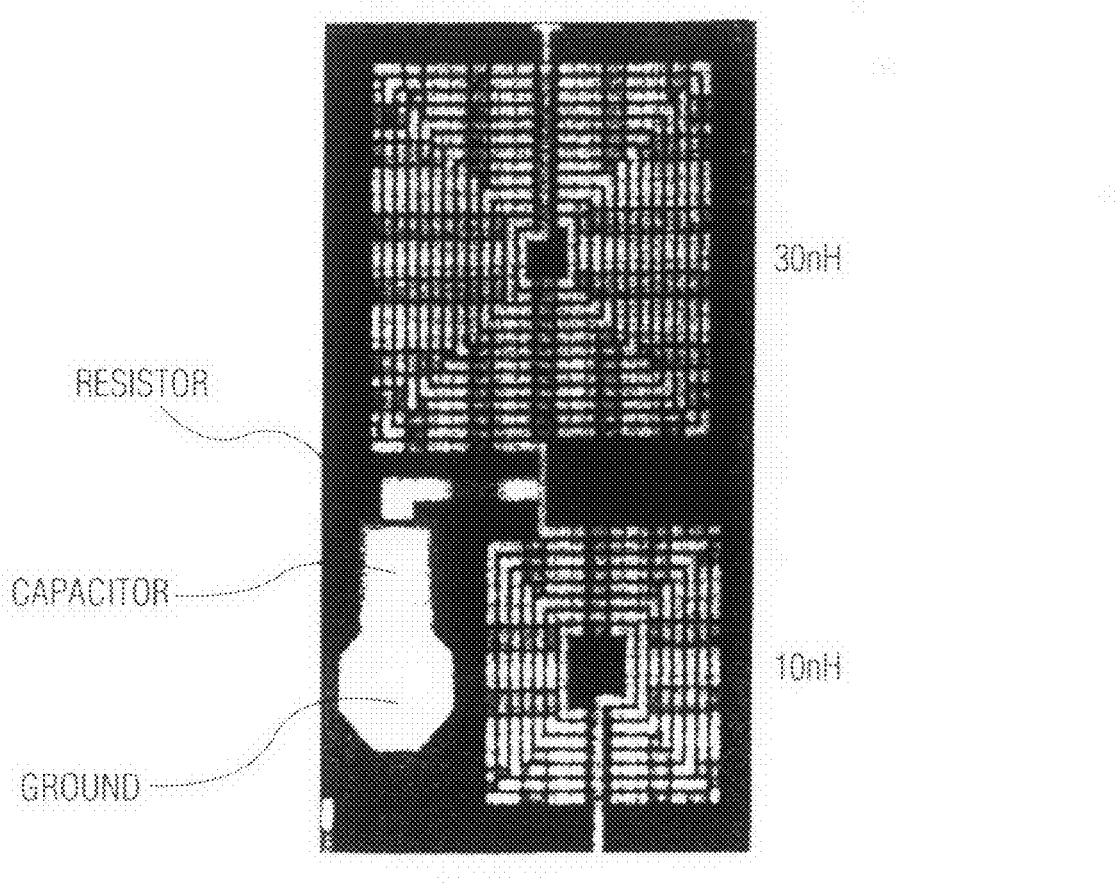
FIG. 9 shows a wideband two stage RF choke in accordance with the invention.
Figure 10:
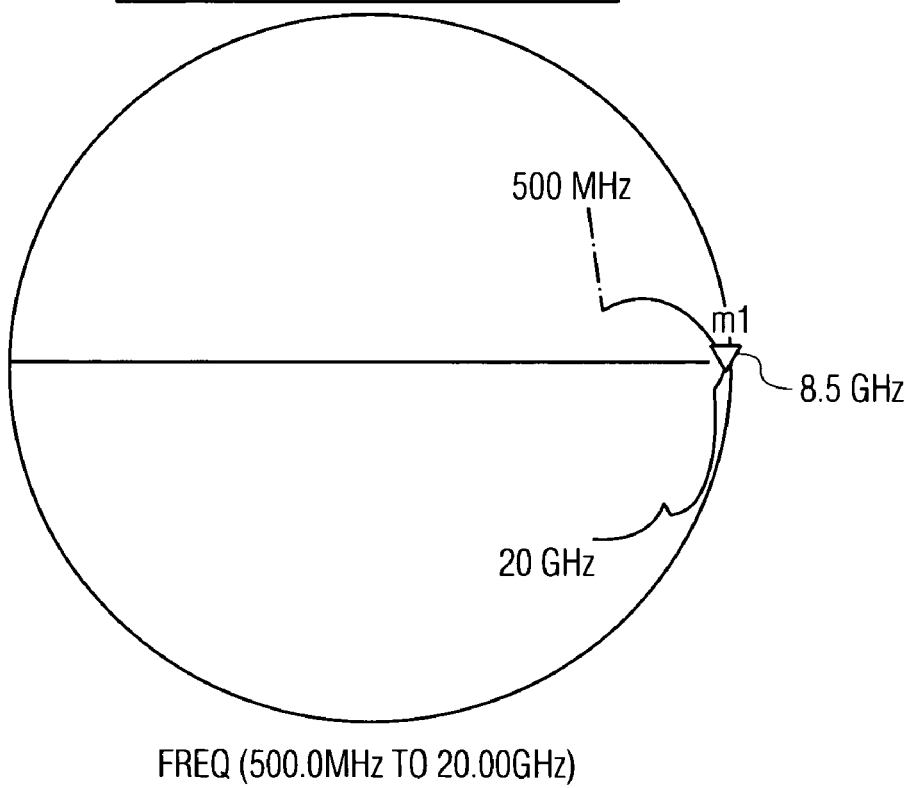
FIG. 10 shows a simulation of the high and low frequency characteristics of the RF choke shown in FIG. 9.

As is apparent from the Smith charts of FIGS. 6 and 8, the inductor in FIG. 5 can function as a high impedance choke at relatively high frequencies, the inductor in FIG. 7 can function as a high impedance choke at relatively low frequencies and it is not possible to implement a wideband RF choke by using a single inductor like those of FIGS. 5 and 7. A wideband RF choke can be achieved, however, by using more than one different size inductors connected in series. Accordingly, FIG. 9 shows an illustrative two stage RF choke comprising a 10 nH inductor like the one shown in FIG. 5 in series with a 30 nH inductor like the one shown in FIG. 7. The structure of FIG. 9 also includes a capacitor in series with a resistor that connects the junction of the two inductors to a ground plane on the back side of the substrate 12 by way of a conventional via through the substrate 12. FIG. 10 is a Smith chart plot of the impedance of the structure of FIG. 9 as a function of frequency. As the Smith chart in FIG. 10 demonstrates, the circuit of FIG. 9 maintains a high inductive impedance over a wider frequency band than the single inductors of FIGS. 5 and 7 and thus can function as a wideband RF choke. Specifically, the RF choke of FIG. 9 maintains a high impedance over a frequency range of about 500 MHz to 20 GHz in FIG. 10. It is also noteworthy that the impedance above 8.5 GHz is capacitive, but not as capacitive as the single inductors become at similar frequencies.

The composition of the substrate 12 that supports the structures shown in FIGS. 5, 7, and 9 can be any dielectric material that permits operation at desired wavelengths, for example, gallium arsenide or silicon. The size of the inductors in FIGS. 5, 7, and 9 can be any length and width that results in a desired impedance. For example, the FIG. 5 inductor and the smaller inductor in FIG. 9 can be about 280 microns long by 280 microns wide; the inductor in FIG. 7 and the larger inductor in FIG. 9 can be about 420 microns long by 420 microns wide. The composition and dimensions of the conductive path that makes up the inductive spiral can be anything that yields a desired inductance and current carrying capacity. For example, the coils of conductive material can be metallic materials such as gold, aluminum, copper, and the like that is electroplated onto the substrate 12 and patterned by photolithography. The thickness of the metallization may be about 1 micron to about 4 microns; the width of each turn of conductive material may be about 10 microns. The spacing between the turns of the coil preferably should be as small as possible, for example, about 5 microns.

Figure 11:
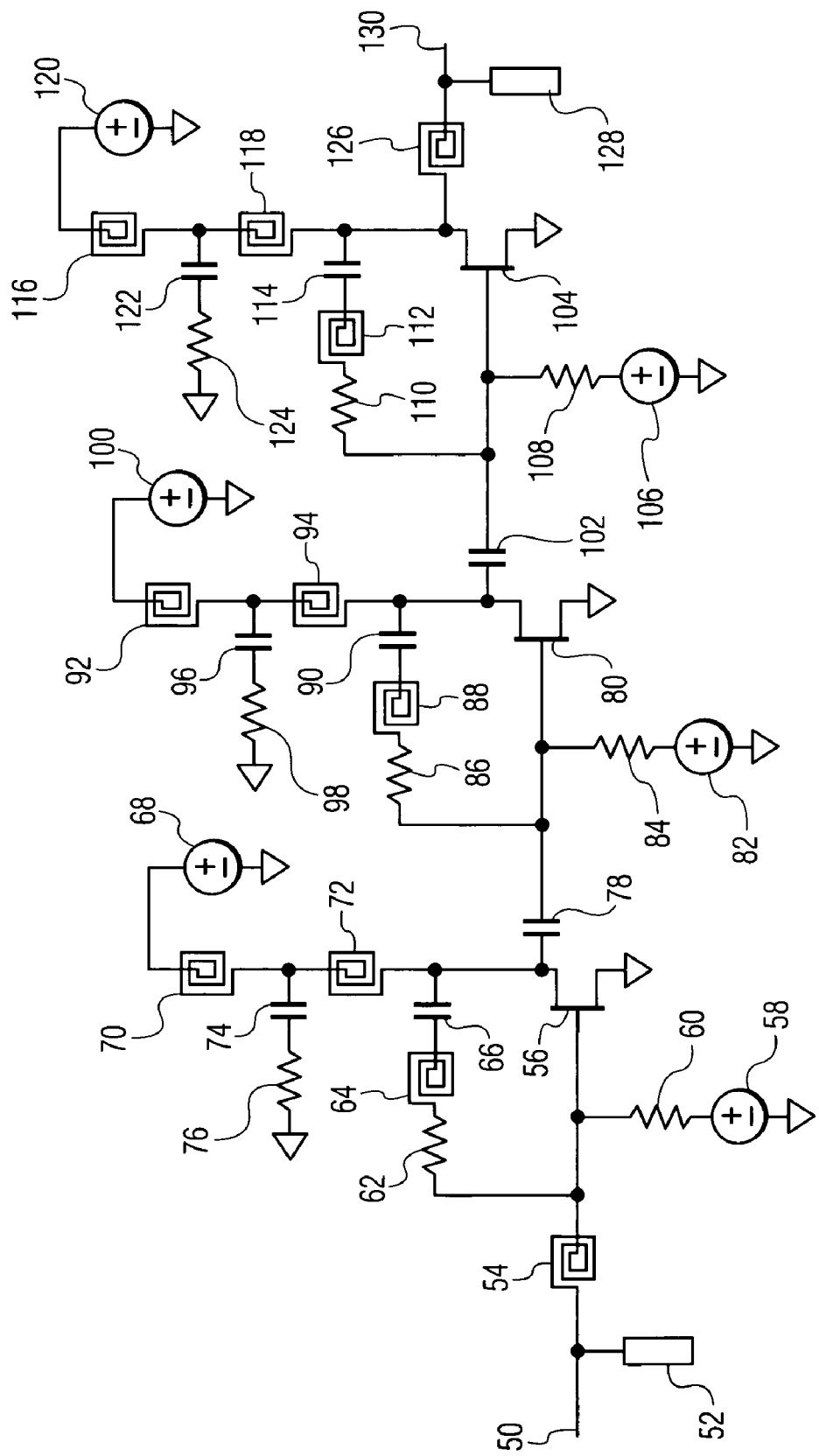
FIG. 11 is a schematic diagram of an illustrative three stage RF amplifier that uses two stage RF chokes in accordance with this invention.

FIG. 11 shows an illustrative application for wideband RF chokes in accordance with this invention, a three stage RF amplifier. Each of the stages in the amplifier uses a two stage RF choke to isolate the DC bias power supply from the transistors used in each stage of amplification. The amplifier of FIG. 11 comprises an input 50 connected to an impedance matching network 52. The impedance matching network may be any combination of resistors, inductors, and/or capacitors that match circuitry upstream of the amplifier to the input of the amplifier. The network can be composed of discrete inductive and capacitive components at relatively low frequencies or an appropriate transmission line at higher frequencies. The input 50 is also connected to a spiral inductor 54 that also is used to assist with the impedance matching function. The inductor 54 is connected to the gate of a field effect transistor 56. A DC voltage source 58 in series with a resistor 60 is connected between ground and the gate of the transistor 56. Voltage source 58 and resistor 60 provide DC bias for the gate of transistor 56. Resistor 60 also provides a desired level of isolation between the source 58 and the gate of the transistor 56. A wideband feedback network, composed of a series connected resistor 62, spiral inductor 64, and capacitor 66, connects the drain and gate of the transistor 56. DC bias for the drain of transistor 56 is provided by a DC bias supply 68 and a wideband two stage RF choke composed of a relatively large inductor 70 in series with a smaller inductor 72, such as the 30 nH inductor in series with a 10 nH inductor shown in FIG. 9. A capacitor 74 in series with a resistor 76 connects the junction of the inductors 70 and 72 to ground. As explained above, such a two stage choke circuit provides high impedance that isolates the DC bias supply 68 from the transistor 56 at a wider range of frequencies than that of a choke circuit using one inductor. Although a two stage inductor is used in the illustrative amplifier of FIG. 11, any number of stages greater that one may be used to achieve high impedance over a desired frequency range, with the inductances and capacitances decreasing from the power supply 68 to the transistor 56 as described above.

A DC blocking capacitor 78 connects the output of the first stage of the amplifier in FIG. 11 to the input of the second stage of the amplifier. Specifically, the blocking capacitor 78 connects the drain of the transistor 56 to the gate of another field effect transistor 80 in the second stage of the amplifier in FIG. 11. The second stage of the amplifier comprises a DC bias voltage source 82 in series with a resistor 84 for the gate of transistor 80 in the second stage of the amplifier. Source 82 and resistor 84 function in a manner similar to that of voltage source 58 and resistor 60 in the first stage of the amplifier. The second stage of the amplifier also includes a wideband feedback network comprising a series connection of a resistor 86, an inductor 88 and a capacitor 90, connected between the drain and gate of the transistor 80. The second stage also includes a two stage wideband RF choke, comprising a relatively large inductor 92 in series with another smaller inductor 94 and a series connection of a capacitor 96 and resistor 98 connecting the junction of the two inductors 92 and 94 to ground. The RF choke isolates the DC bias power supply 100 from the transistor 80 at a wide range of AC frequencies, as explained above.

A DC blocking capacitor 102 connects the output of the second stage of the FIG. 11 amplifier to the input of the third stage. The blocking capacitor 102 connects the drain of transistor 80 and the gate of field effect transistor 104. The third stage of the amplifier of FIG. 11 is similar to the first two stages described above. It comprises a DC bias voltage source 106 in series with a resistor 108 connected between the gate of transistor 104 and ground, a feedback network comprising a resistor 110, a spiral inductor 112, and a capacitor 114 connected in series between the drain and gate of transistor 104, and a wideband RF choke comprising a high inductance spiral inductor 116 and a lower inductance spiral inductor 118 connected in series between a DC bias power supply 120 and the drain of transistor 104. A capacitor 122 in series with a resistor 124 connects the junction of the inductors 116 and 118 to ground. A network composed of an inductance 126 and an impedance matching network 128 connect the drain of the transistor 104 to the output 130 of the amplifier of FIG. 11.

The sources of the field effect transistors 56, 80, and 104 are each connected to ground. Although the amplifier shown in FIG. 11 uses field effect transistors 56, 80, and 104, any other devices that provide suitable amplification, such as bipolar transistors may be used. They may be discrete components mounted on a dielectric substrate or they may be integrated into the substrate.

The principles of this invention can be applied to all kinds of electrical and electronic circuitry, including integrated circuitry and discrete circuitry. The descriptions herein are meant to be illustrative only. The Title, Technical Field, Background, Summary, Brief Description of the Drawings, Detailed Description, and Abstract are meant to illustrate the preferred embodiments of the invention and are not in any way intended to limit the scope of the invention. The scope of the invention is solely defined and limited in the claims set forth below.

The invention claimed is:

1. An amplifier, comprising:
   a transistor;
   a power supply that provides bias current for the transistor;
   a choke connected between the power supply and the transistor, comprising first and second inductors connected in series between an output terminal of the power supply and a bias terminal of the transistor, one of the first and second inductors being closer to the power supply than the other of the first and second inductors, the inductor closer to the power supply having an inductance that is greater than that of the other inductor; and
   a capacitive impedance connecting a junction between the first and second inductors to ground.

2. The amplifier of claim 1, in which the capacitive impedance comprises:

a capacitor; and a resistor in series with the capacitor.

3. The amplifier of claim 1, in which the first and second inductors comprise conductive spirals formed on a dielectric substrate.

4. A method of increasing the frequency range at which a choke provides a high impedance, comprising the step of:

connecting a plurality of inductors in series, the sizes of the inductors in the series decreasing from one end of the series connection to the other end of the series connection; and connecting one or more capacitive impedances from one or more junctions between the inductors to ground.

5. An electrical circuit, comprising:

a source;

a load;

an n-stage wideband choke, where "n" is greater than one, connecting the source and the load, comprising "n" inductors each having a respective inductance connected in series between the source and the load, the inductances of the inductors in the series connection decreasing as a function of distance from the source; and one or more capacitive impedances connecting junctions between the "n" inductors to ground.

6. The circuit of claim 5, in which the one or more capacitive impedances each comprise a resistor in series with a capacitor.

7. The circuit of claim 6, in which the capacitors each have a respective capacitance, the capacitances decreasing as a function of distance from the source.

* * * * *